United States Patent
Asahata

(10) Patent No.: US 10,204,759 B2
(45) Date of Patent: Feb. 12, 2019

(54) COMPOSITE BEAM APPARATUS

(71) Applicant: HITACHI HIGH-TECH SCIENCE CORPORATION, Minato-ku, Tokyo (JP)

(72) Inventor: Tatsuya Asahata, Tokyo (JP)

(73) Assignee: HITACHI HIGH-TECH SCIENCE CORPORATION (JP)

(\*) Notice: Subject to any disclaimer, the term of this patent is extended or adjusted under 35 U.S.C. 154(b) by 0 days.

(21) Appl. No.: 15/696,445

(22) Filed: Sep. 6, 2017

(65) Prior Publication Data

US 2018/0076001 A1    Mar. 15, 2018

(30) Foreign Application Priority Data

Sep. 13, 2016    (JP) .................................. 2016-178426

(51) Int. Cl.
*H01J 37/02*    (2006.01)
*H01J 37/305*    (2006.01)
(Continued)

(52) U.S. Cl.
CPC .......... *H01J 37/026* (2013.01); *H01J 37/141* (2013.01); *H01J 37/292* (2013.01);
(Continued)

(58) Field of Classification Search
USPC .......................... 250/306, 307, 309, 310, 311
See application file for complete search history.

(56) References Cited

U.S. PATENT DOCUMENTS

| 5,677,011 A | 10/1997 | Hatakeyama et al. ........ 427/497 |
| 5,770,861 A * | 6/1998 | Hirose ................ H01J 37/3056 250/306 |
| 2008/0018460 A1* | 1/2008 | Ishiguro ............. H01J 37/3005 340/540 |
| 2011/0163068 A1* | 7/2011 | Utlaut ....................... G03F 1/84 216/66 |

(Continued)

FOREIGN PATENT DOCUMENTS

| JP | 8318378 | 12/1996 |
| JP | 9094677 | 4/1997 |
| JP | 2007164992 | 6/2007 |

OTHER PUBLICATIONS

European Search Report dated Feb. 7, 2018 issued in Application No. EP 17 19 0734.

*Primary Examiner* — Kiet T Nguyen
(74) *Attorney, Agent, or Firm* — Adams & Wilks

(57) ABSTRACT

A composite beam apparatus includes an electron beam column for irradiating an electron beam onto a sample, a focused ion beam column for irradiating a focused ion beam onto the sample to form a cross section, and a neutral particle beam column having an acceleration voltage set lower than that of the focused ion beam column for irradiating a neutral particle beam onto the sample to perform finish processing of the cross section. The electron beam column, the focused ion beam column, and the neutral particle beam column are arranged such that the beams of the columns cross each other at an irradiation point. A controller controls the electron beam column to irradiate and scan the electron beam on the sample during cross section processing by the focused ion beam column and during finish processing by the neutral particle beam column. The composite beam apparatus is capable of suppressing the influence of charge build-up, or electric field or magnetic field leakage from an electron beam column, when subjecting a sample to cross-section (Continued)

processing with a focused ion beam and then performing finishing processing with another beam.

10 Claims, 4 Drawing Sheets

(51) Int. Cl.
*H01J 37/141* (2006.01)
*H01J 37/29* (2006.01)
*H05H 3/00* (2006.01)

(52) U.S. Cl.
CPC ............ *H01J 37/3056* (2013.01); *H05H 3/00* (2013.01); *H01J 2237/1405* (2013.01)

(56) References Cited

U.S. PATENT DOCUMENTS

| | | | |
|---|---|---|---|
| 2013/0105302 A1 | 5/2013 | Nanri et al. | 204/192.33 |
| 2016/0093470 A1 | 3/2016 | Kagarice et al. | |
| 2016/0247662 A1* | 8/2016 | Fujii | H01J 37/222 |

* cited by examiner

COMPOSITE BEAM APPARATUS

CROSS REFERENCE TO RELATED APPLICATION(S)

This application claims the benefit of Japanese Patent Application No. 2016-178426, filed Sep. 13, 2016, which is hereby incorporated by reference in its entirety into this application.

BACKGROUND OF THE INVENTION

1. Technical Field

The present invention relates generally to a composite beam apparatus that is configured to have an electron beam column and a focused ion beam column, and to form and observe a cross section of a sample.

2. Description of the Related Art

As well known to those skilled in the art, a FIB-SEM apparatus equipped with a focused ion beam column configured to irradiate a focused ion beam (FIB) onto a sample to form a cross section has been used as a scanning electron microscope (SEM). As a result, an electron beam is irradiated from the SEM to a cross section processed by the focused ion beam, whereby cross section processing of the sample, and observation and measurement of the cross section can be carried out in situ in one apparatus.

In addition, a technique for finish processing has been developed, wherein a third beam column that irradiates a gas ion beam having lower energy such as argon compared to the focused ion beam column is installed at the FIB-SEM apparatus, and the processing-damaged layer generated on the surface of the sample due to FIB processing is irradiated with the gas ion beam and removed (Patent Document 1).

In particular, in recent years, there are many cases in which it is required to determine the end point of cross section processing of the sample in a state in which a specific pattern is exposed, so it is necessary to determine the processing end point while observing by the SEM the processing surface (cross section) during processing with the gas ion beam.

DOCUMENTS OF RELATED ART (Patent Document 1) Japanese Patent Application Publication No. 2007-164992

SUMMARY OF THE INVENTION

In the case of a FIB-SEM apparatus, recently there are requirements for a high resolution SEM. To meet such requirements, the following have been adopted: a semi-in-lens type in which a magnetic field of an electron lens is made stronger; or the sample is placed in or near the magnetic field of the lens to shorten the focal distance.

However, when the SEM has high resolution, there is a problem in that the amount of the electric field and the magnetic field that leak from the apex of the SEM column (electron beam column) onto the surface of the sample is increased, and the low energy-gas ion beam performing finish processing of the cross section is deflected in these electric fields and magnetic fields. Particularly, in the case of a semi-in-lens type SEM of higher resolution than an out-lens type SEM, the amount of the electric field and the magnetic field that leak from the SEM becomes remarkable.

Moreover, when the gas ion beam is deflected, it is difficult to simultaneously use the SEM column and the third beam column, and thus it is difficult to determine the end point of cross section processing while observing with the SEM. As a result, processing by the gas ion beam has to be performed after waiting until the electric field or the magnetic field of the SEM column is attenuated after cross-section observation is completed, so the working efficiency is lowered.

On the other hand, when operating the third beam column to approach the sample in order to reduce the deflection of the low energy gas ion beam, interference with the SEM column or the FIB column may occur, or the magnetic field or electric field of the electron lens of the SEM column may be affected.

Further, when the sample is subjected to cross section processing with the FIB, charge build-up of the sample is caused by ion beam irradiation, and then the low energy gas ion beam is deflected, whereby it is difficult to maintain an appropriate irradiation position. Furthermore, there is also a problem in that such charge build-up causes drift in the SEM image, so that secondary electrons are not generated and thus the secondary electron signal is reduced, and the processing end point is difficult to identify by the SEM image.

In particular, there is an increasing need for diversification of materials used in electronic devices, analysis of various materials, and processing of insulating material samples such as biological samples. Accordingly, it is necessary to solve the above problems occurring due to charge build-up caused by the ion beam irradiation.

Accordingly, the present invention has been made keeping in mind the above problems occurring in the prior art, and an object of the present invention is to provide a composite beam apparatus capable of suppressing the influence of charge build-up, or electric field or magnetic field leakage from the electron beam column when subjecting a sample to cross-section processing with a focused ion beam and then performing finishing processing with another beam.

In order to accomplish the above object, the present invention provides a composite beam apparatus, including: an electron beam column irradiating an electron beam onto a sample; a focused ion beam column irradiating a focused ion beam onto the sample to form a cross section; a neutral particle beam column having an acceleration voltage set lower than an acceleration voltage of the focused ion beam column, and irradiating a neutral particle beam onto the sample to perform finish processing of the cross section, wherein the electron beam column, the focused ion beam column, and the neutral particle beam column are arranged such that each of the irradiated the beams from the respective beam columns crosses one another at an irradiation point P.

According to the composite beam apparatus, by using the neutral particle beam as the beam for performing finish processing of the cross section of the sample, even if the neutral particle beam has low energy because the acceleration voltage of the neutral particle beam is lower than that of the ion beam performing rough processing of the cross section, it is possible to avoid the influence of the electric field or the magnetic field that leaks from the SEM column, so that the state of the cross section during finish processing can be simultaneously observed by the SEM. In addition, since finish processing of the cross section and SEM observation can be performed simultaneously, there is no need to cause cross-section processing to stand by until the electric field or the magnetic field of the SEM column is attenuated, thereby improving the working efficiency.

Particularly, when SEM observation is performed with the semi-in-lens type having a higher resolution than the out-lens type, the amount of leakage of the electric field or the magnetic field becomes remarkable, so that the present invention becomes more effective. When SEM observation is performed with the semi-in-lens type, the state of the cross section during finish processing can be observed with higher resolution.

Moreover, even if charge build-up occurs on the sample by irradiation of the ion beam when subjecting the sample to cross-section processing with the ion beam, the neutral particle beam can be used, so that it is possible to perform finish processing of the cross section without being affected by charge build-up.

A distance L1 between an apex of the electron beam column and irradiation point (P), a distance L2 between an apex of the focused ion beam column and the irradiation point (P), and a distance L3 between an apex of the neutral particle beam column and the irradiation point (P) satisfy a relationship of L1<L2<L3.

According to the composite beam apparatus, by minimizing L1, a focal distance of the SEM column is shortened while avoiding the interference of the columns, and high-resolution SEM observation can be performed. Meanwhile, in the case of the neutral particle beam, there is no repulsion between particles due to charge. Accordingly, even if L3 is larger than L2, and the neutral particle beam is accelerated by a lower acceleration voltage than the focused ion beam, it is possible to form a beam having a beam diameter required for finish processing.

Further, by maximizing L3, the neutral particle beam column can be spaced apart from the SEM column, so that it is possible to reduce deterioration of the performance of the electron beam and the secondary electron detector due to breaking of rotational symmetry of the electric field or the magnetic field that leaks from the SEM column.

The electron beam column may have an objective lens focusing the electron beam on the sample, the objective lens being selectively configurable to an out-lens mode or a semi-in-lens mode; the neutral particle beam column is able to selectively irradiate the neutral particle beam or an ion beam generated by ionizing the neutral particle beam; and the composite beam apparatus may further include a beam irradiation setting means irradiating the ion beam from the neutral particle beam column when the objective lens is set to the out-lens mode.

As described above, since the neutral particle beam has no electric charge, it is difficult to narrow or deflect the beam. Accordingly, by irradiating the ion beam from the neutral particle beam column onto the sample, and by adjusting the irradiation position of the ion beam, it is possible to precisely adjust the irradiation position from the relationship between the set values of various deflectors and the focusing lens of the ion beam to the sample of the neutral particle beam.

In addition, when the objective lens of the SEM column is set to the out-lens mode, the amount of the electric field or the magnetic field that leaks from the SEM column is small compared to the semi-lens-mode. Thus, the influence on the adjustment of the irradiation position of the ion beam from the neutral particle beam column can be reduced.

According to the present invention, when subjecting the sample to cross-section processing with the focused ion beam and then performing finish processing with another beam, it is possible to suppress the influence of charge build-up, or the influence of electric field or magnetic field leakage from an electron beam column.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
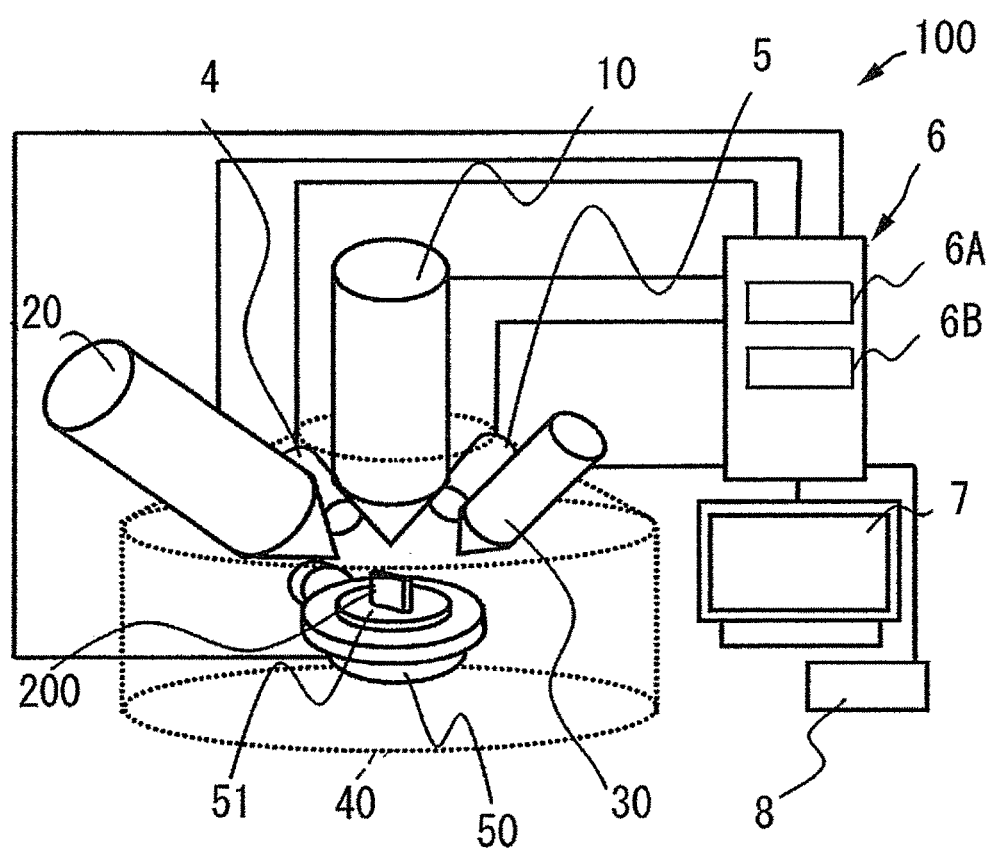
FIG. 1 is a view showing an overall configuration of a composite beam apparatus according to an embodiment of the present invention.

The present invention will be described in detail below with reference to the accompanying drawings. Repeated descriptions and descriptions of known functions and configurations which have been deemed to obfuscate the gist of the present invention will be omitted below. The embodiments of the present invention are intended to fully describe the present invention to a person having ordinary knowledge in the art to which the present invention pertains. Accordingly, the shapes, sizes, etc. of components in the drawings may be exaggerated to make the description clearer.

Hereinafter, embodiments of the present invention will be described with reference to the drawings. An electron beam, a focused ion beam, and a neutral particle beam may be collectively referred to as "beams." An electron beam column, a focused ion beam column, and a neutral particle beam column may be collectively referred to as "beam columns" or "columns." Where it is stated that each beam "crosses one another," it is meant that each beam crosses both of the remaining beams at one point.

FIG. 1 is a block diagram showing an overall configuration of a composite beam apparatus 100 according to an embodiment of the present invention. Referring to FIG. 1, the composite beam apparatus 100 includes an electron beam column (SEM column) 10, a focused ion beam column (FIB column) 20, a neutral particle beam column 30, a secondary electron detector 4, a gas gun 5, a controller 6, a display unit 7, an input unit 8, a stage 50, and a sample holder 51 provided on the stage.

A part or all of components of the composite beam apparatus 100 are provided in a vacuum chamber 40 and a pressure in the vacuum chamber 40 is reduced to a predetermined degree of vacuum.

The stage 50 movably supports the sample holder 51 and a sample 200 is placed on the sample holder 51. In addition, the stage 50 has a moving mechanism capable of displacing the sample holder 51 in five axes. This moving mechanism includes: an XYZ moving mechanism for moving the sample holder 51 along X and Y axes that are parallel to the horizontal plane and perpendicular to each other and along a Z axis perpendicular to the X and Y axes respectively; a rotation mechanism rotating the sample holder 51 around the X axis; and a tilt mechanism for rotating the sample holder 51 around the X axis (or the Y axis). The stage 50 displaces the sample holder 51 in five axes such that the sample is displaced to an irradiation position of an electron beam 10A, an ion beam 20A, and a neutral particle beam 30A (to an irradiation point P at which the irradiation beams 10A to 30A cross each other).

Each of the irradiation beams 10A to 30A is irradiated to a surface (cross section) of the sample 200 at the irradiation point P, whereby processing or SEM observation is performed.

The controller 6 consists of a computer having a central processing unit (CPU), a storage unit (RAM and ROM) for storing data and programs and an input port and an output port for inputting and outputting signals to/from an external device. The controller 6 executes various arithmetic processing by the CPU based on the program stored in the storage unit, and controls respective components of the composite beam apparatus 100. In addition, the controller 6 is electrically connected to control wires and the like of the electron beam column 1, the focused ion beam column 2, the neutral particle beam column 3, the secondary electron detector 4, and the stage 50.

The controller 6 has a beam irradiation setting means 6A, and a mode switching control device 6B, which will be described later.

Further, the controller 6 drives the stage 50 based on a command of software or an input of an operator, and adjusts a position and an orientation of the sample 200 to adjust an irradiation position or an irradiation angle of the electron beam 10A, the ion beam 20A, and the neutral particle beam 30A to the surface of the sample 200.

Further, the controller 6 is connected to the input unit 8 such as a keyboard for acquiring an input command of the operator, and to the display unit 7 for displaying an image and the like of the sample.

Figure 3:
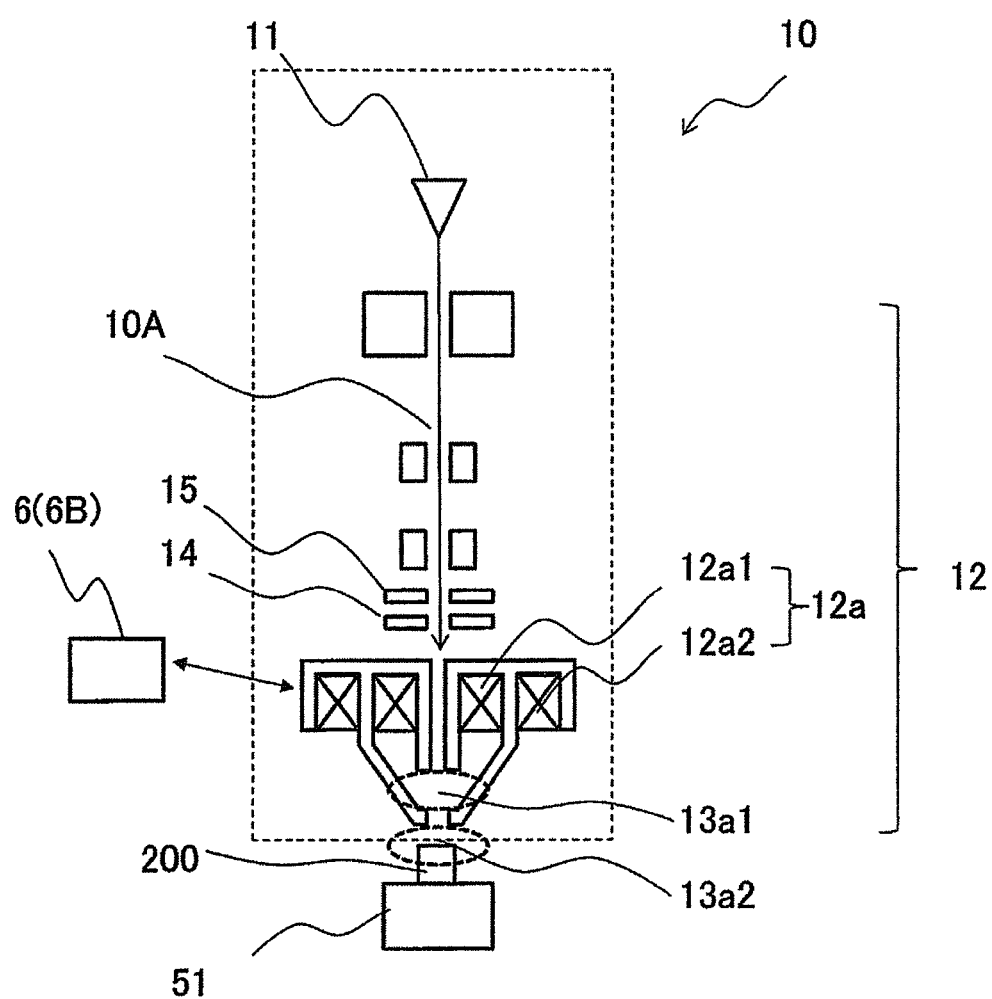
FIG. 3 is a view showing a configuration of a SEM column.

As shown in FIG. 3, the SEM column 10 includes an electron source 11 for emitting electrons, and an electron optics 12 for scanning electrons emitted from the electron source 11 while forming the electrons in a beam form. The electron beam 10A emitted from the electron beam column 10 is irradiated onto the sample 200, thereby generating secondary electrons from the sample 200. The generated secondary electrons are detected at a secondary electron detector 15 in the column, or at the secondary electron detector 4 outside the column to obtain an image of the sample 200. Also, reflected electrons are detected at a reflected electron detector 14 in the column to obtain an image of the sample 200. Further, the secondary electron detector 15 is placed closer to the electron source 11 than the reflected electron detector 14. However, the reflected electron detector 14 may be placed closer to the electron source 11 than the secondary electron detector 15.

The electron optics 12 includes, for example, a condenser lens for condensing the electron beam 10A, an aperture for narrowing the electron beam 10A, an aligner for adjusting an optical axis of the electron beam 10A, an objective lens 12a for focusing the electron beam 10A relative to the sample 200, and a deflector for scanning the electron beam 10A on the sample 200.

The objective lens 12a is provided with a ring-shaped first coil 12a1 placed inside the SEM column 10 in an axial direction of the SEM column 10, and a ring-shaped second coil 12a2 surrounding the outer periphery of the first coil 12a1, the first and second coils being concentrically placed around the axis. Further, when a current flows through the first coil 12a1, a magnetic field is generated thus forming a first lens (out lens) 13a1. When a current flows through the second coil 12a2, a magnetic field is generated thus forming a second lens (semi-in-lens) 13a2. Here, the second lens 13a2 having a short focal distance is placed closer to the sample 200 than the first lens 13a1, whereby high resolution can be realized.

Further, the mode switching control device 6B selectively switches the currents of the first coil 12a1 and the second coil 12a2 to selectively switch an out-lens mode and a semi-in-lens mode.

Figure 4:
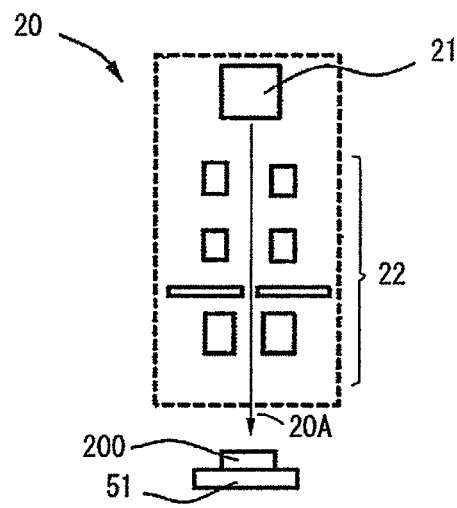
FIG. 4 is a view showing a configuration of a FIB column.

As shown in FIG. 4, the FIB column 20 includes an ion source 21 for generating ions, and an ion optics 22 for scanning ions emitted from the ion source 21 while forming the ions into a focused ion beam. When the ion beam 20A that is a charged particle beam is irradiated from the FIB column 20 onto the sample 200, secondary charged particles such as secondary ions or secondary electrons are generated from the sample 200. The secondary charged particles are detected at the secondary electron detector 4 thus obtaining an image of the sample 200. In addition, the FIB column 20 performs etching processing (cross section processing) on the sample 200 in the irradiation range by increasing the irradiation amount of the ion beam 20A.

The ion optics 22 has a well-known configuration and includes, for example, a condenser lens for condensing the ion beam 20A, an aperture for narrowing the ion beam 20A, an aligner for adjusting an optical axis of the ion beam 20A, an objective lens for focusing the ion beam 20A relative to the sample, and a deflector for scanning the ion beam 20A on the sample.

Here, the constituent member such as a lens provided in the vacuum chamber 40 of the FIB column 20 may be made of a non-magnetic material in order to reduce the influence on a magnetic field leaking from the SEM column 10.

Figure 5:
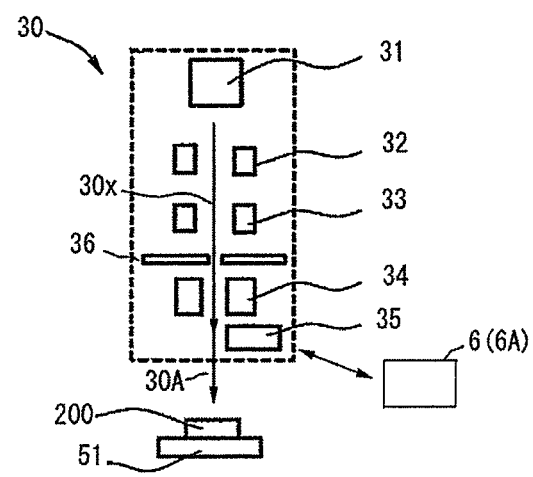
FIG. 5 is a view showing a configuration of a neutral particle beam column.

As shown in FIG. 5, the neutral particle beam column 30 includes an ion source 31 for generating ions, a condenser lens 32 for condensing an ion beam from the ion source 31, a blanking means 33, an aperture 36 narrowing an ion beam 30x, an objective lens 34 for focusing the ion beam 30x, a neutralization mechanism 35 neutralizing the ion beam 30x focused on the objective lens 34. The ion beam 30x is neutralized by the neutralization mechanism 35 and irradiated onto the sample 200 as the neutral particle beam 30A.

The condenser lenses 32 to the objective lens 34 constitute optics of the neutral particle beam column 30.

Here, the constituent member such as a lens provided in the vacuum chamber 40 of the neutral particle beam column 30 may be made of a non-magnetic material in order to reduce the influence on the magnetic field leaking from the SEM column 10.

The ion source 31 generates, for example, argon ions. The neutralization mechanism 35 generates electrons by, for example, a pulse discharge method, and neutralizes the electrons by colliding the electrons with the argon ions.

The neutral particle beam 30A may be a single particle, or may be a cluster of two or more particles.

This cluster can be formed by using a cluster ion source instead of the ion source 31, injecting a raw material gas such as argon from a thin nozzle, adiabatically expanding it, and ionizing it. Then, the cluster ions are focused to some extent by the optics, and neutralized by the neutralization mechanism 35, thereby generating a neutral cluster beam, which is a kind of neutral particle beam 30A.

Further, when the beam irradiation setting means 6A turns on the operation of the neutralization mechanism 35, the neutral particle beam 30A can be irradiated from the neutral particle beam column 30. On the other hand, when the beam irradiation setting means 6A turns off the operation of the neutralization mechanism 35, the ion beam 30x can be irradiated from the neutral beam column 30.

In addition, when the beam irradiation setting means 6A turns on the operation of the neutralization mechanism 35, the neutral cluster beam can be irradiated from the neutral particle beam column 30. On the other hand, when the beam irradiation setting means 6A turns off the operation of the neutralization mechanism 35, a cluster ion beam can be irradiated from the neutral particle beam column 30.

When the mode switching control device 6B sets the objective lens 12a to the out-lens mode, the beam irradiation setting means 6A turns off the operation of the neutralization mechanism 35 based on a command from the mode switching control device 6B and thus the ion beam 30x (or cluster ion beam) can be irradiated from the neutral particle beam column 30.

The gas gun 5 emits a predetermined gas such as an etching gas onto the sample 200. As the electron beam 10A, the ion beam 20A, or the neutral particle beam 30A is irradiated onto the sample 200 while supplying the etching gas from the gas gun 5, an etching rate of the sample by a beam irradiation can be increased. Further, as the electron beam 10A, the ion beam 20A, or the neutral particle beam 30A is irradiated onto the sample 200 while supplying a compound gas from the gas gun 5, a local deposition of a gas component may be generated in the vicinity of an irradiation region of the beam.

Next, an example of measurement by the composite beam apparatus 100 according to the embodiment of the present invention will be described.

First, the sample 200 is subjected to cross-section processing by irradiating the FIB (ion beam) 20A from the FIB column 20 onto the sample 200.

Then, during the cross-section processing by the FIB column 20, the electron beam 10A is irradiated from the SEM column 10 in the out-lens mode while being scanned, and the reflected electrons reflected from a cross section of the sample 200 are detected by the reflected electron detector 14 in the SEM column 10, and thus an obtained reflected electron image is observed. Further, the secondary electrons generated from the cross section of the sample 200 may be detected by the secondary electron detector 15 or the secondary electron detector 4 and thus an obtained secondary electron image may be observed.

In this manner, the state of the cross section of the sample 200 during rough processing by the FIB (ion beam) 20A is simultaneously observed by the SEM.

Next, the neutral particle beam 30A is irradiated from the neutral particle beam column 30 onto the sample 200, thereby performing finish processing of the cross section. An acceleration voltage of the neutral particle beam column 30 is set to be lower than that of the FIB column 20, and it is possible to reduce the damage to the sample 200 from irradiation and to make fine finish processing possible.

Then, during finish processing of the cross section by the neutral particle beam column 30, the electron beam 10A is irradiated from the SEM column 10 in the semi-in-lens mode while being scanned, and thus an obtained reflected electron image or secondary electron image is observed.

In this manner, the state of the cross section of the sample 200 during finish processing by the neutral particle beam 30A is simultaneously observed by the SEM, and then irradiation of the neutral particle beam 30A is terminated at the time when a desired cross-sectional shape is obtained.

As described above, by using the neutral particle beam 30A as the beam for performing finish processing of the cross section of the sample 200, even if the neutral particle beam 30A has low energy because the acceleration voltage of the neutral particle beam 30A is lower than that of the ion beam 20A performing rough processing of the cross section, it is possible to avoid the influence of the electric field or the magnetic field that leaks from the SEM column 10, so that the state of the cross section during finish processing can be simultaneously observed by the SEM. In addition, since finish processing of the cross section and SEM observation can be performed simultaneously, there is no need to cause cross-section processing to stand by until the electric field or the magnetic field of the SEM column 10 is attenuated, thereby improving the working efficiency.

Particularly, when SEM observation is performed with the semi-in-lens type having a higher resolution than the out-lens type, the amount of leakage of the electric field or the magnetic field becomes remarkable, so that the present invention becomes more effective. When SEM observation is performed with the semi-in-lens type, the state of the cross section during finish processing can be observed with higher resolution, so that a fine cross-sectional shape can be observed accurately, and processing can be terminated.

Moreover, even if charge build-up occurs on the sample by irradiation of the ion beam 20A when cross-section processing is performed on the sample 200 using the ion beam 20A, it is possible to perform finish processing of the cross section without being affected by charge build-up by using the neutral particle beam 30A.

Further, during finish processing of the cross section, when the neutral particle beam 30A is irradiated onto the sample 200, secondary electrons are generated. When these secondary electrons are detected by the secondary electron detector 4, low energy secondary electrons that are generated by irradiation of the neutral particle beam act as background noise, and thus a SEM image may not be clear. Thus, when a SEM image is obtained using the reflected electron detector 14 (BSE detector) in the SEM column 10 without using the secondary electron detector 4, the influence of the secondary electrons generated by the neutral particle beam 30A can be excluded.

In addition, by using the blanking means 33, when the ions generated from the ion source 31 are intermittently deflected in the neutral particle beam column 30 so as not to be irradiated to the outside of the column, SEM observation can be performed while the neutral particle beam 30A is not irradiated, and cross-section processing can be performed when the neutral particle beam 30A is irradiated. Accordingly, it is possible to realize quasi-real time observation or a function of cut-and-see.

Figure 2:
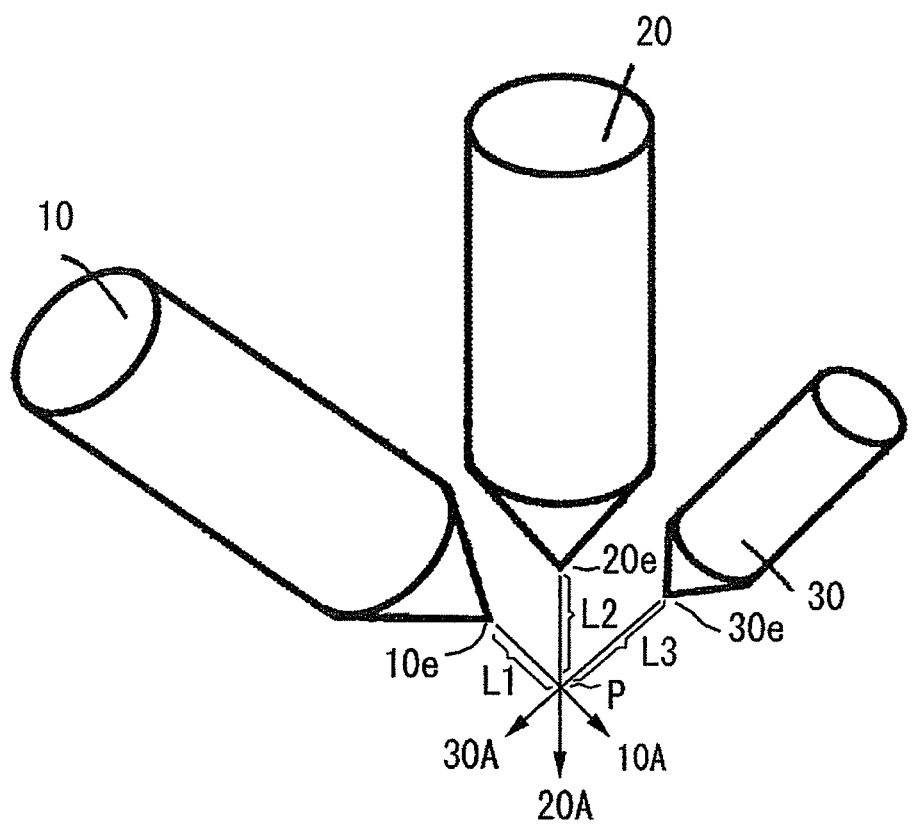
FIG. 2 is a view showing an irradiation point where irradiation beams cross.

Here, as shown in FIG. 2, when a distance between an apex 10e of the SEM column 10 and the irradiation point P is L1, a distance between an apex 20e of the FIB column 20 and the irradiation point P is L2, and a distance between an apex 30e of the neutral particle beam column 30 and the irradiation point P is L3, it is preferable that a relationship of L1<L2<L3 be satisfied.

Here, the apexes 10e to 30e of the columns are physical apex portions of the columns, respectively. Further, L1 to L3 correspond to working distances WD.

By minimizing L1, a focal distance of the SEM column 10 is shortened and high-resolution SEM observation can be performed. In addition, by making L2 smaller than L1, a focal distance of the focused ion beam column 20 is shortened and the focused ion beam 20A is focused on the sample 200, thereby forming a sharp cross-section on the sample 200. Meanwhile, in the case of the neutral particle beam 30A, there is no repulsion between particles due to charge.

Accordingly, even if L3 is larger than L2, and the neutral particle beam 30A is accelerated by a lower acceleration voltage than the focused ion beam 20A, it is possible to form a beam having a beam diameter required for finish processing. Here, the beam diameter required for finish processing is a diameter within a range in which a material which is sputtered by irradiating a component other than the sample such as the sample holder, is not reattached to the sample, and is about 100 to 200 min in the case of finish processing of a TEM sample. Further, even when the neutral particle beam column 30 is not provided with a scanning means, flat finish processing can be performed by spot irradiation as long as the beam diameter is within the above range.

Further, by maximizing L3, the neutral particle beam column 30 can be spaced apart from the SEM column 10, so that it is possible to reduce deterioration of the performance of the electron beam 10A and the secondary electron detector 15 due to breaking of rotational symmetry of the electric field or the magnetic field that leaks from the SEM column 10.

Further, when the objective lens 12a of the SEM column 10 is set to the out-lens mode by the beam irradiation setting means 6A, the mode switching control device 6B may control such that the ion beam 30x is irradiated from the neutral particle beam column 30 onto the sample 200.

As described above, since the neutral particle beam 30A has no electric charge, it is difficult to narrow or deflect the beam. Accordingly, by turning off the neutralization mechanism 35 of the neutral particle beam column 30, the ion beam 30x generated from the ion source 31 is directly irradiated toward the sample 200. Here, the irradiation position of the ion beam to the sample 200 can be precisely adjusted by various deflectors or focusing lenses.

In addition, in this case, since the objective lens 12a of the SEM column 10 is set to the out-lens mode, the amount of the electric field or the magnetic field that leaks from the SEM column 10 is small compared to the semi-lens-mode. Thus, the influence on adjustment of the irradiation position of the ion beam from the neutral particle beam column 30 can be reduced. Moreover, in the optics of the SEM column 10, the offset amount between the modes is compensated such that an observation position by the electron beam 10A in the out-lens mode and an observation position by the electron beam 10A in the semi-in-lens mode match with each other. As a result, it is possible to more precisely adjust the irradiation position of the neutral particle beam 30A in the semi-in-lens mode, based on the irradiation position of the ion beam 30x from the neutral particle beam column 30 in the out-lens mode.

Further, after irradiation position adjustment of the ion beam is completed, the mode switching control device 6B turns on the neutralization mechanism 35 of the neutral particle beam column 30, and then the neutral particle beam 30A generated by neutralizing the ion beam is irradiated onto the sample 200, thereby performing finish processing of the cross section. Further, here, the beam irradiation setting means 6A may switch the objective lens 12a of the SEM column 10 to the semi-in-lens mode.

In the above embodiment, the SEM column 10 of the semi-in-lens type has been described. Also, the present invention is effective for the SEM column 10 of the retarding type in which a voltage is applied to the sample holder 51 to form an electric field for decelerating the electron beam 10A between the apex of the SEM column 10 and the sample holder 51.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A composite beam apparatus, comprising:
an electron beam column irradiating an electron beam onto a sample;
a focused ion beam column irradiating a focused ion beam onto the sample to form a cross section; and
a neutral particle beam column having an acceleration voltage set lower than an acceleration voltage of the focused ion beam column, and irradiating a neutral particle beam onto the sample to perform finish processing of the cross section,
wherein the electron beam column, the focused ion beam column, and the neutral particle beam column are arranged such that each of the irradiated beams from the respective beam columns crosses one another at an irradiation point (P) and during cross section processing by the focused ion beam column and finish processing of the cross section by the neutral particle beam column, the electron beam column is set to irradiate and scan with the electron beam.

2. The composite beam apparatus of claim 1, wherein a distance L1 between an apex of the electron beam column and the irradiation point (P), a distance L2 between an apex of the focused ion beam column and the irradiation point (P), and a distance L3 between an apex of the neutral particle beam column and the irradiation point (P) satisfy a relationship of L1<L2<L3.

3. The composite beam apparatus of claim 2, wherein the electron beam column has an objective lens focusing the electron beam on the sample, the objective lens being selectively configurable to an out-lens mode or a semi-in-lens mode;
the neutral particle beam column is able to selectively irradiate the neutral particle beam or an ion beam generated by ionizing the neutral particle beam; and
the composite beam apparatus further comprises a beam irradiation setting means irradiating the ion beam from the neutral particle beam column when the objective lens is set to the out-lens mode.

4. The composite beam apparatus of claim 1, wherein the electron beam column has an objective lens focusing the electron beam on the sample, the objective lens being selectively configurable to an out-lens mode or a semi-in-lens mode;
the neutral particle beam column is able to selectively irradiate the neutral particle beam or an ion beam generated by ionizing the neutral particle beam; and
the composite beam apparatus further comprises a beam irradiation setting means irradiating the ion beam from the neutral particle beam column when the objective lens is set to the out-lens mode.

5. A composite beam apparatus, comprising:
an electron beam column irradiating an electron beam onto a sample;
a focused ion beam column irradiating a focused ion beam onto the sample to form a cross section; and
a neutral particle beam column having an acceleration voltage set lower than an acceleration voltage of the focused ion beam column, and irradiating a neutral particle beam onto the sample to perform finish processing of the cross section,
wherein the electron beam column, the focused ion beam column, and the neutral particle beam column are arranged such that each of the irradiated beams from the respective beam columns crosses one another at an irradiation point (P), and wherein a distance L1 between an apex of the electron beam column and the irradiation point (P), a distance L2 between an apex of the focused ion beam column and the irradiation point (P), and a distance L3 between an apex of the neutral particle beam column and the irradiation point (P) satisfy a relationship of L1<L2<L3.

6. The composite beam apparatus of claim 5, wherein the electron beam column has an objective lens focusing the electron beam on the sample, the objective lens being selectively configurable to an out-lens mode or a semi-in-lens mode;

the neutral particle beam column is able to selectively irradiate the neutral particle beam or an ion beam generated by ionizing the neutral particle beam; and the composite beam apparatus further comprises a beam irradiation setting means irradiating the ion beam from the neutral particle beam column when the objective lens is set to the out-lens mode.

7. A composite beam apparatus, comprising:

an electron beam column that irradiates an electron beam onto a sample;

a focused ion beam column that irradiates a focused ion beam onto the sample to form a cross section; and a neutral particle beam column which has an acceleration voltage set lower than an acceleration voltage of the focused ion beam column, and which irradiates a neutral particle beam onto the sample to perform finish processing of the cross section, wherein the electron beam column, the focused ion beam column, and the neutral particle beam column are arranged such that each of the irradiated beams from the respective beam columns crosses one another at an irradiation point (P); and a controller configured to control the electron beam column to irradiate and scan the electron beam on the sample during cross section processing of the sample by the focused ion beam column and during finish processing of the cross section of the sample by the neutral particle beam column.

8. The composite beam apparatus according to claim 7, wherein a distance L1 between an apex of the electron beam column and the irradiation point (P), a distance L2 between an apex of the focused ion beam column and the irradiation point (P), and a distance L3 between an apex of the neutral particle beam column and the irradiation point (P) satisfy a relationship of L1<L2<L3.

9. The composite beam apparatus according to claim 8, wherein the electron beam column has an objective lens that focuses the electron beam on the sample, the objective lens being selectively configurable to an out-lens mode or a semi-in-lens mode;

the neutral particle beam column is configured to selectively irradiate the neutral particle beam or an ion beam generated by ionizing the neutral particle beam; and the controller comprises a beam irradiation setting means for irradiating the ion beam from the neutral particle beam column when the objective lens is set to the out-lens mode.

10. The composite beam apparatus according to claim 7, wherein the electron beam column has an objective lens that focuses the electron beam on the sample, the objective lens being selectively configurable to an out-lens mode or a semi-in-lens mode;

the neutral particle beam column is configured to selectively irradiate the neutral particle beam or an ion beam venerated by ionizing the neutral particle beam; and the controller comprises a beam irradiation setting means for irradiating the ion beam from the neutral particle beam column when the objective lens is set to the out-lens mode.

* * * * *